United States Patent
Doi

(10) Patent No.: US 11,042,017 B2
(45) Date of Patent: Jun. 22, 2021

(54) POINT-SPREAD-FUNCTION MEASUREMENT DEVICE AND MEASUREMENT METHOD, IMAGE ACQUISITION APPARATUS, AND IMAGE ACQUISITION METHOD

(71) Applicant: OLYMPUS CORPORATION, Tokyo (JP)

(72) Inventor: Atsushi Doi, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 356 days.

(21) Appl. No.: 16/059,453

(22) Filed: Aug. 9, 2018

(65) Prior Publication Data

US 2018/0373010 A1 Dec. 27, 2018

Related U.S. Application Data

(63) Continuation of application No. PCT/JP2016/058012, filed on Mar. 14, 2016.

(51) Int. Cl.
*G02B 21/00* (2006.01)
*G01N 21/64* (2006.01)
*H01J 37/28* (2006.01)
*H01J 37/285* (2006.01)

(52) U.S. Cl.
CPC .......... *G02B 21/008* (2013.01); *G01N 21/64* (2013.01); *G02B 21/00* (2013.01);
(Continued)

(58) Field of Classification Search
CPC .. G02B 21/008; G02B 21/00; G02B 21/0036; G02B 21/0072; G02B 21/0076;
(Continued)

(56) References Cited

U.S. PATENT DOCUMENTS

2006/0108525 A1  5/2006 Nakagaki et al.
2006/0214106 A1* 9/2006 Wolleschensky .... G02B 21/008
250/341.2
(Continued)

FOREIGN PATENT DOCUMENTS

EP  2963672 A1  1/2016
EP  2963673 A1  1/2016
(Continued)

OTHER PUBLICATIONS

International Search Report dated Jun. 14, 2016 issued in PCT/JP2016/058012.
(Continued)

*Primary Examiner* — William R Alexander
*Assistant Examiner* — Rahman Abdur
(74) *Attorney, Agent, or Firm* — Scully, Scott, Murphy & Presser, P.C.

(57) ABSTRACT

A point-spread-function measurement device includes: a scanner that scans two illumination light beams emitted from a light source; an illumination optical system that radiates the two illumination light beams scanned by the scanner onto a sample; a relative-position adjustor that changes a relative irradiation position, in the sample, between the two illumination light beams radiated by the illumination optical system; a detection optical system that detects signal light generated at an overlapping position, in the sample, of the illumination light beams radiated by the illumination optical system; and a calculator that calculates a point spread function based on the signal light detected by the detection optical system and the relative irradiation position between the two illumination light beams when the signal light is detected.

32 Claims, 11 Drawing Sheets

(52) U.S. Cl.
CPC ..... *G02B 21/0036* (2013.01); *G02B 21/0072* (2013.01); *G02B 21/0076* (2013.01); *H01J 37/28* (2013.01); *H01J 37/285* (2013.01)

(58) Field of Classification Search
CPC .............. G02B 21/367; G02B 21/0048; G02B 21/0032; G02B 11/24; G02B 21/06; G02B 21/32; G02B 21/0064; G02B 21/004; G02B 21/0044; G01N 21/64; G01N 21/9501; G01N 21/956; G01N 21/8806; G01N 21/6458; G01N 21/645; G01N 21/21; G01N 21/55; H01J 37/28; H01J 37/285
USPC ........................................................ 359/385
See application file for complete search history.

(56) References Cited

U.S. PATENT DOCUMENTS

| | | | |
|---|---|---|---|
| 2011/0267688 A1* | 11/2011 | Kleppe | G02B 21/0072 359/385 |
| 2014/0246612 A1* | 9/2014 | Spiecker | G01J 1/42 250/578.1 |
| 2014/0321772 A1* | 10/2014 | Piche | G02B 21/002 382/284 |
| 2016/0013015 A1* | 1/2016 | Potocek | H01J 37/28 250/307 |

FOREIGN PATENT DOCUMENTS

| | | |
|---|---|---|
| JP | 2006-317261 A | 11/2006 |
| JP | 4512471 B2 | 7/2010 |
| JP | 2011-028208 A | 2/2011 |
| JP | 2015-007809 A | 1/2015 |
| JP | 2015-155970 A | 8/2015 |
| JP | 2016-015315 A | 1/2016 |

OTHER PUBLICATIONS

Shaevitz et al., "Enhanced three-dimensional deconvolution microscopy using a measured depth-varying point-spread function", Journal of the Optical Society of America A (Sep. 2007), vol. 24, No. 9, pp. 2622-2627, cited in spec on p. 1.

* cited by examiner

POINT-SPREAD-FUNCTION MEASUREMENT DEVICE AND MEASUREMENT METHOD, IMAGE ACQUISITION APPARATUS, AND IMAGE ACQUISITION METHOD

CROSS-REFERENCE TO RELATED APPLICATIONS

This is a Continuation Application of International Application No. PCT/JP2016/058012 filed on Mar. 14, 2016, the content of which is incorporated herein by reference in its entirety.

TECHNICAL FIELD

The present invention relates to point-spread-function measurement devices and measurement methods, image acquisition apparatuses, and image acquisition methods.

BACKGROUND ART

In an image acquisition apparatus such as a two-photon excitation microscope, the spatial resolution of an image is set solely in accordance with the point spread function of an excitation laser. In particular, when observing a deep section of a sample, since the shape of the point spread function extends in accordance with the refractive index of the sample or scattering, the spatial resolution of the image deteriorates.

A known method involves ascertaining the shape of the point spread function and reducing blurriness of the image by performing deconvolution (for example, see Non Patent Literature 1).

This method involves disposing a microscopic fluorescence bead within a sample and moving the fluorescence bead by optical trapping so as to measure the point spread function at a freely-chosen position.

CITATION LIST

Non Patent Literature

NPL 1
J. W. Shaevitz and D. A. Fletcher, "Enhanced three-dimensional deconvolution microscopy using a measured depth-varying point-spread function," J. Opt, Soc. Am. A, Vol. 24, 2622 (2007)

SUMMARY OF INVENTION

An aspect of the present disclosure provides a point-spread-function measurement device including: a scanner configured to scan two illumination light beams emitted from a light source; an illumination optical system configured to radiate the two illumination light beams scanned by the scanner onto a sample; a relative-position adjustor configured to change a relative irradiation position, in the sample, between the two illumination light beams radiated by the illumination optical system; a detection optical system configured to detect signal light generated at an overlapping position, in the sample, of the illumination light beams radiated by the illumination optical system; and a calculator configured to calculate a point spread function based on the signal light detected by the detection optical system and the relative irradiation position between the two illumination light beams when the signal light is detected.

Another aspect of the present disclosure provides a point-spread-function measurement method including: scanning two illumination light beams emitted from a light source over a sample while changing a relative irradiation position in the sample; detecting signal light generated at an overlapping position, in the sample, of the illumination light beams radiated; and calculating a point spread function based on the signal light detected and the relative irradiation position between the two illumination light beams when the signal light is detected.

DESCRIPTION OF EMBODIMENTS

A point-spread-function measurement device 25 and measurement method, an image acquisition apparatus 1, and an image acquisition method according to embodiments of the present invention will be described below with reference to the drawings.

Figure 1:
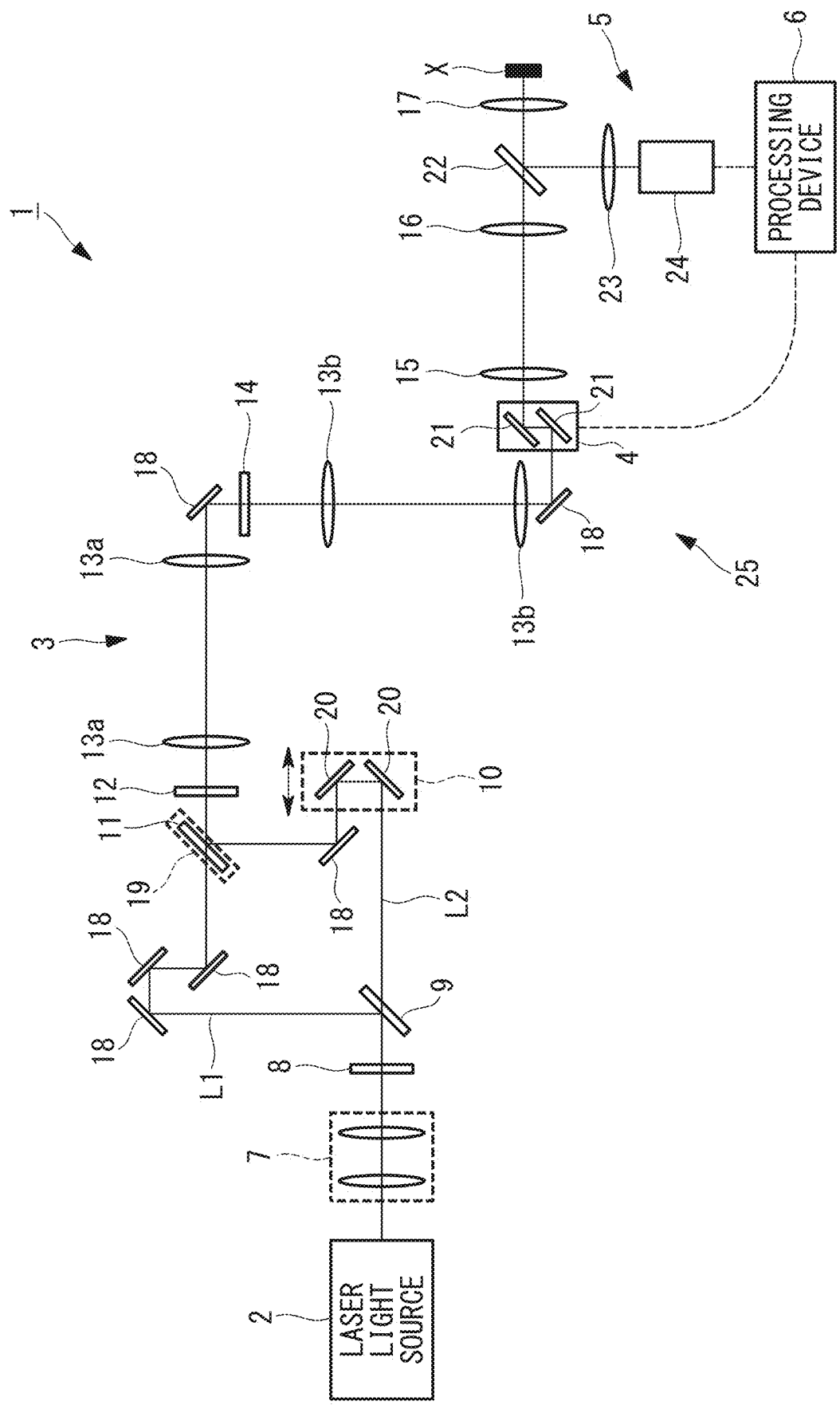
FIG. 1 schematically illustrates an image acquisition apparatus according to an embodiment of the present invention.

As shown in FIG. 1, the image acquisition apparatus 1 according to this embodiment is a multiphoton-excitation-type (more specifically, a two-photon-excitation-type) scanning fluorescence microscope and includes: a light source (laser light source) 2, such as a titanium-sapphire laser, emitting a near-infrared ultra-short pulsed laser beam (referred to as "laser beam" hereinafter); an illumination optical system 3 that radiates the laser beam from the light source 2 onto a sample X; a scanning unit 4 that is disposed at an intermediate position of the illumination optical system 3 and that two-dimensionally scans the laser beam; a detection optical system 5 that detects fluorescence (signal light) generated in the sample X as a result of the sample X being irradiated with the laser beam; and a processing device 6 that calculates a point spread function (referred to as "PSF" hereinafter) based on the intensity of the fluorescence detected by the detection optical system 5 and that reconfigures an image by using the calculated PSF.

The illumination optical system 3 includes a beam-diameter adjustment optical system 7 that adjusts the beam diameter of the laser beam from the light source 2, a half-wave plate 8 that sets the polarization direction of the laser beam to 45°, a first polarization beam splitter 9 that splits the laser beam into two optical paths, an optical-path-length adjustment optical system (timing adjustment unit) 10 provided in one of the optical paths, a second polarization beam splitter 11 that multiplexes the laser beams (first laser beam and second laser beam) traveling along the two optical paths, a quarter-wave plate 12 that allows the multiplexed laser beam to pass therethrough, two pairs of relay lenses 13a and 13b, a beam shaping element (light modulating unit) 14, a pupil projection lens 15, an imaging lens 16, and an objective lens 17. In the drawing, reference sign 18 denotes a mirror for forming an optical path.

The first polarization beam splitter 9 receives the laser beam after the polarization direction thereof is set to 45° by the half-wave plate 8 so as to split the input laser beam into a first laser beam (illumination light beam) L1 and a second laser beam (illumination light beam) L2 with an intensity ratio of 1:1 and having polarization directions orthogonal to each other.

The second polarization beam splitter 11 is set in a motorized holder (relative-position adjustment unit) 19 whose tilt angle is independently controllable along two axes. When the tilt angle of the second polarization beam splitter 11 is changed by actuating the motorized holder 19, the first laser beam L1 transmitted through the second polarization beam splitter 11 is transmitted substantially straight therethrough substantially without being polarized, whereas the polarization angle of the second laser beam L2 reflected by the first polarization beam splitter 9 is changed. Consequently, the angle of the second laser beam L2 input to the scanning unit 4 changes, so that the relative irradiation position between the first laser beam L1 and the second laser beam L2 in the sample X changes.

The optical-path-length adjustment optical system 10 causes a pair of mirrors 20 to move in the direction of the arrow so as to adjust the optical-path length of the second laser beam L2, thus causing the pulses of the first laser beam L1 and the second laser beam L2 to be synchronous after the laser beams are multiplexed by the second polarization beam splitter 11.

The quarter-wave plate 12 converts the multiplexed first laser beam L1 and second laser beam L2 into circularly-polarized light.

The scanning unit 4 includes, for example, a two-axis galvanometer mirror 21 and is disposed between the relay lens 13b and the pupil projection lens 15. The scanning unit 4 is disposed at an optically conjugate position with respect to the second polarization beam splitter 11, the beam shaping element 14, and the pupil position of the objective lens 17 by means of the two pairs of relay lenses 13a and 13b, the pupil projection lens 15, and the imaging lens 16.

The detection optical system 5 includes a dichroic mirror 22 that is disposed between the imaging lens 16 and the objective lens 17 and that splits off fluorescence collected by the objective lens 17 from the optical path, a focusing lens 23 that focuses the fluorescence split off by the dichroic mirror 22, and a photodetector 24, such as a photomultiplier tube, that detects the focused fluorescence.

The processing device 6 includes a calculating unit (not shown) that calculates a PSF and an image processor (not shown) that reconfigures a fluorescence image by using the calculated PSF. The components from the light source 2 to the calculating unit included in the processing device 6 constitute the PSF measurement device 25 according to an embodiment of the present invention.

Figure 3:
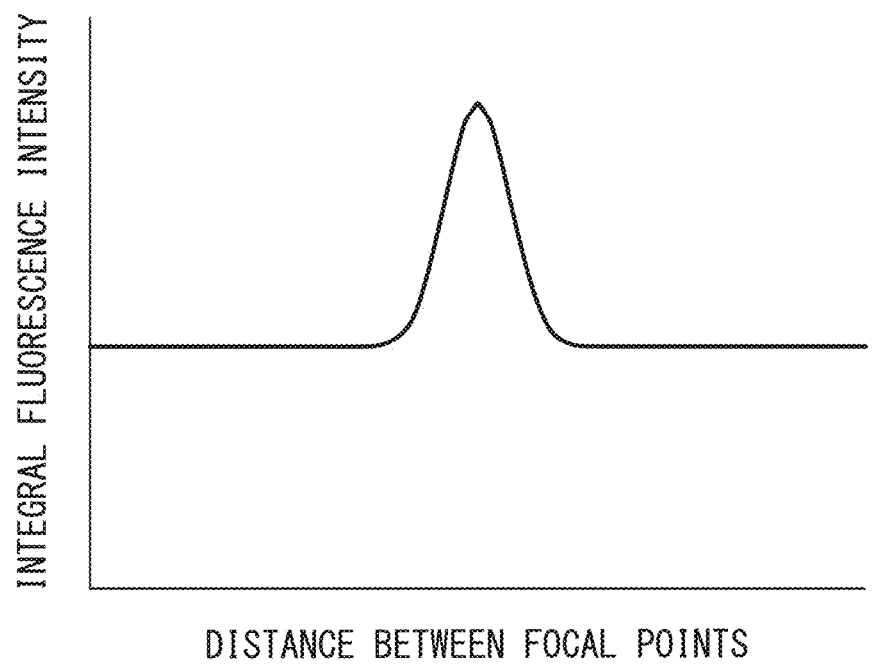
FIG. 3 illustrates the fluorescence intensity distribution with respect to the distance between focal points acquired by the measurement device in FIG. 2.

For each relative distance between the first laser beam L1 and the second laser beam L2 set by the motorized holder 19, the calculating unit integrates the intensity of each fluorescence image acquired by actuating the scanning unit 4 and plots the integral value of the fluorescence intensity with respect to the relative distance, so that the fluorescence intensity distribution in FIG. 3 is obtained.

The calculating unit also removes an offset component from the fluorescence intensity distribution in FIG. 3.

Figure 4:
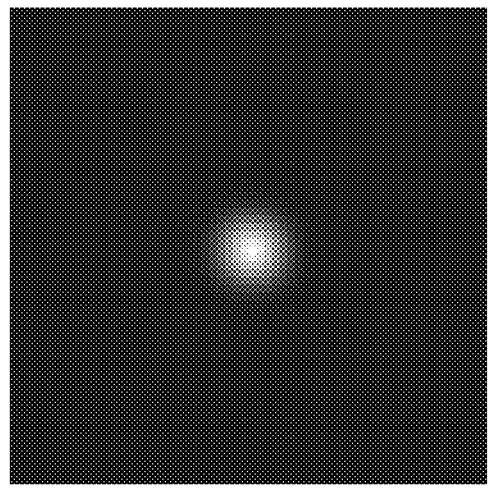
FIG. 4 illustrates an autocorrelation waveform image of a laser beam acquired by removing an offset component from the fluorescence intensity distribution in FIG. 3 and rotating the fluorescence intensity distribution.
Figure 5:
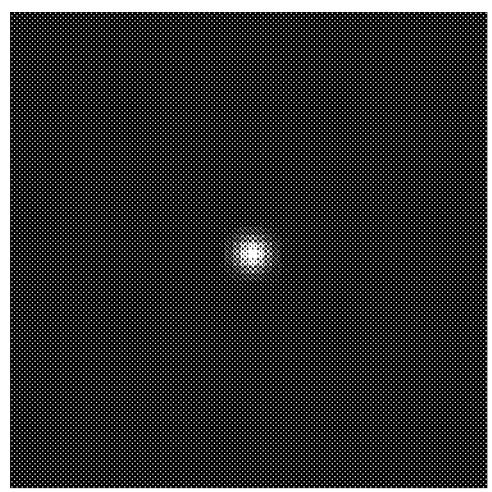
FIG. 5 illustrates the spatial distribution of the PSF of two-photon-excitation fluorescence calculated by using the autocorrelation waveform image in FIG. 4.

Furthermore, the calculating unit rotates the waveform of the fluorescence intensity distribution, from which the offset component is removed, around an axis extending through the peak so as to create a rotationally symmetric image shown in FIG. 4, performs two-dimensional Fourier transformation on the created image, raises the obtained image to the power of ½, then performs two-dimensional inverse Fourier transformation on the obtained image, and raises the obtained image to the power of 2. Consequently, a two-photon-excitation PSF spatial distribution is acquired, as shown in FIG. 5.

The processing in the calculating unit will be described below by using mathematical expressions.

The excitation light intensity including both the first laser beam L1 and the second laser beam L2 and the fluorescence intensity generated accordingly are expressed with mathematical expressions. The excitation light intensity $I_{ex}$ in a case where electrical field amplitudes of the first laser beam L1 and the second laser beam L2 are defined as E1 and E2 is expressed with expression (1).

$$I_{ex} = |E_1 + E_2|^2 = |E_1|^2 + |E_2|^2 + E^*_1 E_2 + E_1 E^*_2 = I_1 + I_2 + E^*_1 E_2 + E_1 E^*_2 \quad (1)$$

In expression (1), "★" denotes the complex conjugate, and $I_1$ and $I_2$ respectively denote intensities of the first laser beam L1 and the second laser beam L2.

Since it is assumed that a two-photon-excitation microscope is used in this embodiment, the fluorescence intensity is proportional to the square of the excitation light intensity. The fluorescence intensity is expressed with expression (2) in a case where this proportionality factor is defined as α.

$$I_{fl\_2P} = \alpha I_{ex}^2 \quad (2)$$
$$= \alpha(I_1 + I_2 + E^*_1 E_2 + E_1 E^*_2)^2$$
$$= \alpha \left\{ \begin{array}{c} I_1^2 + I_2^2 + 2I_1 I_2 + \\ 2(I_1 + I_2)(E^*_1 E_2 + E_1 E^*_2) + \\ (E^*_1 E_2 + E_1 E^*_2)^2 \end{array} \right\}$$

As mentioned above, the first laser beam L1 and the second laser beam L2 are converted by the second polarization beam splitter 11 into light beams that are linearly polarized orthogonal to each other and are subsequently converted into circularly-polarized light beams by the quarter-wave plate 12. In this case, the first laser beam L1 and the second laser beam L2 do not interfere with each other, and the fourth term and the fifth term in expression (2) are small enough to be negligible, as compared with other terms. Specifically, expression (2) can be simplified into expression (3).

$$I_{fl\_2P} = \alpha(I_1^2 + I_2^2 + 2I_1 I_2) \tag{3}$$

The first term and the second term in expression (3) indicate fluorescence components generated by being independently excited by the first laser beam L1 and the second laser beam L2, regardless of the relative position between the focal points of the first laser beam L1 and the second laser beam L2. On the other hand, the third term in expression (3) indicates an intensity integral of the first laser beam L1 and the second laser beam L2 and corresponds to overlapping of the focal points. Specifically, when the focal point of the first laser beam L1 and the focal point of the second laser beam L2 are in a completely non-overlapped state, the third term is zero. When the focal point of the first laser beam L1 and the focal point of the second laser beam L2 are in a completely overlapped state, the third term is a maximum value.

Figure 2:
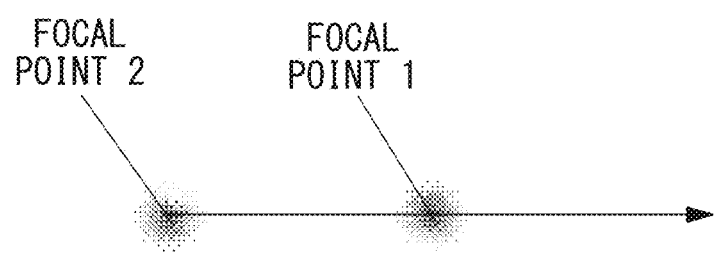
FIG. 2 illustrates a relative position between two laser beams in accordance with a point-spread-function measurement device according to an embodiment of the present invention included in the image acquisition apparatus in FIG. 1.

FIG. 2 illustrates an example of the positions of the focal point of the first laser beam L1 and the focal point of the second laser beam L2. Reference sign P1 denotes the focal point of the first laser beam L1, and reference sign P2 denotes the focal point of the second laser beam L2. In FIG. 2, the focal points are not overlapped with each other. It is assumed that an image of the sample X is acquired while changing the relative distance between the focal points P1 and P2. Specifically, the image is acquired while moving the focal point of the second laser beam L2 in the direction of the arrow in FIG. 2 by using the motorized holder 19 to change the polarization angle of the second laser beam L2.

More specifically, in a state where the focal point P2 of the second laser beam L2 is located at the position in FIG. 2, a two-dimensional fluorescence image of the sample X is acquired by actuating the scanning unit 4. Then, the focal point P2 is moved by predetermined steps in the direction of the arrow in FIG. 2, and another fluorescence image of the sample X is acquired in this state. By repeating this process, a fluorescence image of the sample X is acquired for each relative distance between the focal points P1 and P2.

The fluorescence images acquired in this manner each have a fluorescence intensity in which the state of overlapping of the focal points P1 and P2 is reflected. Specifically, the fluorescence intensity changes in accordance with expression (3). In particular, the third term changes in accordance with the overlapping of the focal points P1 and P2.

The integral fluorescence intensity distribution in FIG. 3, which is obtained by integrating the fluorescence intensities within the respective fluorescence images acquired in this manner and plotting them relative to the relative distance between the focal points P1 and P2, has a shape in which the integral fluorescence intensity changes in accordance with the relative distance between the focal points P1 and P2 and particularly has a peak at a position where the relative distance between the focal points P1 and P2 is zero.

This implies that the overlapping region of the focal points P1 and P2 is at a maximum in this state and that the third term in expression (3) is at a maximum. The offset component of the fluorescence intensity distribution in FIG. 3 does not change even when the relative distance between the focal points P1 and P2 changes, and corresponds to the sum of the first term and the second term in expression (3).

Next, a process for removing the offset component will be described. One method for removing the offset component involves detecting a signal value when the focal points P1 and P2 have a relative distance therebetween and thus do not overlap in the form of an offset value, and then subtracting the offset value from the overall fluorescence intensity distribution. It is clear from expression (3) that, when the light intensities of the focal point P1 and the focal point P2 are equal to each other (i.e., when $I_1 = I_2$), the peak value of the waveform is twice as large as the offset value. Thus, it is possible to calculate ½ of the peak value and calculate the difference from the overall waveform.

However, if there are fluorescent molecules in a peripheral region of an image, in the direction in which relative scanning of the focal points P1 and P2 is performed, the waveform in FIG. 3 is not properly obtained due to the effect of the distribution of the fluorescence molecules, and the value is not fixed even when the focal points P1 and P2 have a relative distance therebetween and thus do not overlap. In such a case, the offset-component removing method described above cannot be applied.

In this case, a method of using the optical-path-length adjustment optical system 10 may be applied. Specifically, the fluorescence intensity distribution in FIG. 3 is acquired by varying the optical-path length of the first laser beam L1 and the optical-path length of the second laser beam L2 by adjusting the optical-path-length adjustment optical system 10. In a state where the optical-path length of the first laser beam L1 and the optical-path length of the second laser beam L2 are different from each other, the pulse of the first laser beam L1 and the pulse of the second laser beam L2 are not simultaneously radiated onto the sample X, so that the contribution of the third term in expression (3) becomes lost. Specifically, only an offset component constituted of the sum of the first term and the second term in expression (3) is obtained.

Accordingly, the process of acquiring the fluorescence intensity distribution in FIG. 3 in a state where the first laser beam L1 and the second laser beam L2 are simultaneously radiated onto the sample X and the process of acquiring the fluorescence intensity distribution in FIG. 3 in a state where the first laser beam L1 and the second laser beam L2 are not simultaneously radiated onto the sample X are performed by switching the optical-path-length adjustment optical system 10, and the difference is calculated, whereby an offset-removed fluorescence intensity distribution can be acquired.

In this offset-component removing method that utilizes the optical-path-length adjustment optical system 10, the fluorescent molecules to be excited are the same when the pulse of the first laser beam L1 and the pulse of the second laser beam L2 are simultaneously radiated onto the sample X and when the pulse of the first laser beam L1 and the pulse of the second laser beam L2 are non-simultaneously radiated onto the sample X, so that the effect of the distribution of the fluorescent molecules is also removed when calculating the difference. This is advantageous in that the offset component can be properly removed regardless of the distribution of the fluorescent molecules.

The fluorescence intensity distribution from which the offset component is removed in this manner is such that the relative distance between the focal points P1 and P2 of the first laser beam L1 and the second laser beam L2 in the third term of expression (3) is changed, and can be expressed as the convolution of the two laser beams L1 and L2 having the same intensity I, as indicated in expression (4).

$$G(u) = \int_{-\infty}^{\infty} I(x) \cdot I(x-u) dx \tag{4}$$

Subsequently, the fluorescence intensity distribution from which the offset component is removed is rotated around a line extending through the peak, thereby creating a rotationally symmetric image shown in FIG. 4. In this image, the cross-sectional profile is an autocorrelation waveform in FIG. 3 at any angle. This image is a two-dimensionally developed form of expression (4) and can be expressed with expression (5).

$$G(u,v) = \int_{-\infty}^{\infty} \int_{-\infty}^{\infty} I(u,v) \cdot I(x-u, y-v) dx dy \quad (5)$$

Because a convolution in actual space can be replaced by a product in Fourier space, when expression (5) is two-dimensionally Fourier-transformed, the excitation light intensity I can be expressed as the square of the Fourier-transformed result, as in expression (6). Therefore, as indicated by expression (7), by performing a two-dimensional inverse Fourier transformation by raising expression (6) to the power of ½, the spatial distribution of the excitation light intensity I, that is, the PSF shape of the laser beam at the focal point, can be acquired. Then, by raising this excitation light intensity I to the power of 2, the shape of the two-photon-excitation PSF is obtained.

$$\mathcal{F}\{G(u,v)\} = [\mathcal{F}\{I(u,v)\}]^2 \quad (6)$$

$$I(u,v) = \mathcal{F}^{-1}\{[\mathcal{F}\{G(u,v)\}]^{1/2}\} \quad (7)$$

In order to obtain the excitation light intensity I by performing the inverse Fourier transformation by raising expression (6) to the power of ½, as in expression (7), the convolutions have to be of the same excitation light intensity I, as in expression (4). In order to achieve this, the polarization directions of the focal points P1 and P2 are set to be orthogonal to each other by the two polarization beam splitters 9 and 11 in FIG. 1, whereby the fourth term and the fifth term in expression (2) can be removed.

The image processor uses the PSF acquired in the above-described manner to perform deconvolution, thereby improving the image resolution. An example of deconvolution that may be applied includes Wiener deconvolution, which is widely known.

A process of observing the sample X involves acquiring an image in a state where the first laser beam L1 and the second laser beam L2 are completely overlapped or acquiring an image in a state where only one of the first laser beam L1 and the second laser beam L2 is radiated onto the sample X, and performing deconvolution of the acquired image by using the already-determined PSF.

As the image acquired in the state where the first laser beam L1 and the second laser beam L2 are completely overlapped, an image selected from images acquired while changing the relative position between the focal points P1 and P2 may be used.

If only one of the first laser beam L1 and the second laser beam L2 is to be radiated onto the sample X, for example, the half-wave plate 8 may be rotated so that all components are reflected by or transmitted through the first polarization beam splitter 9. Accordingly, the PSF-shape measurement and the image acquisition for observing the sample X can be switched therebetween without losing the power of the laser beams.

Figure 6:
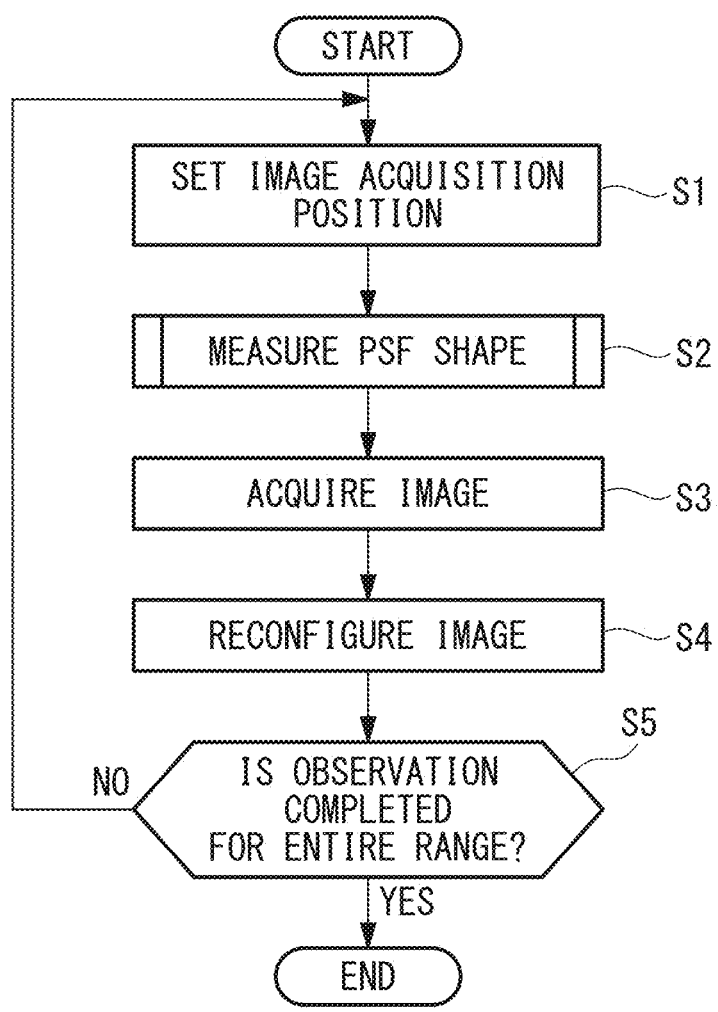
FIG. 6 is a flowchart illustrating an image acquisition method according to an embodiment of the present invention in a case where a PSF-shape measurement position and an image acquisition position are the same.

FIG. 6 illustrates an example of flow from PSF-shape measurement to high-resolution-image acquisition of the sample X in accordance with deconvolution.

Referring to FIG. 6, an image acquisition method according to an embodiment of the present invention includes setting an image acquisition position within the sample X (step S1), measuring the PSF shape at that position (step S2), subsequently acquiring an image of the sample X (image generating step S3, image processing step), performing a reconfiguring process (deconvolution) on that image by using the measured PSF (reconfiguring step S4, image processing step), and determining whether or not there is another position where the PSF shape is to be measured (step S5). If it is determined that observation is completed for the entire range, the measurement ends. If it is necessary to observe the sample X at a different field of view within the sample X, the process returns to the setting of the image acquisition position from step S5 so as to repeat the process from step S1. The reconfiguring step S4 does not have to be performed for each image acquisition process at every field of view, and may be performed collectively after the measurement for the entire field of view is completed.

Figure 7:
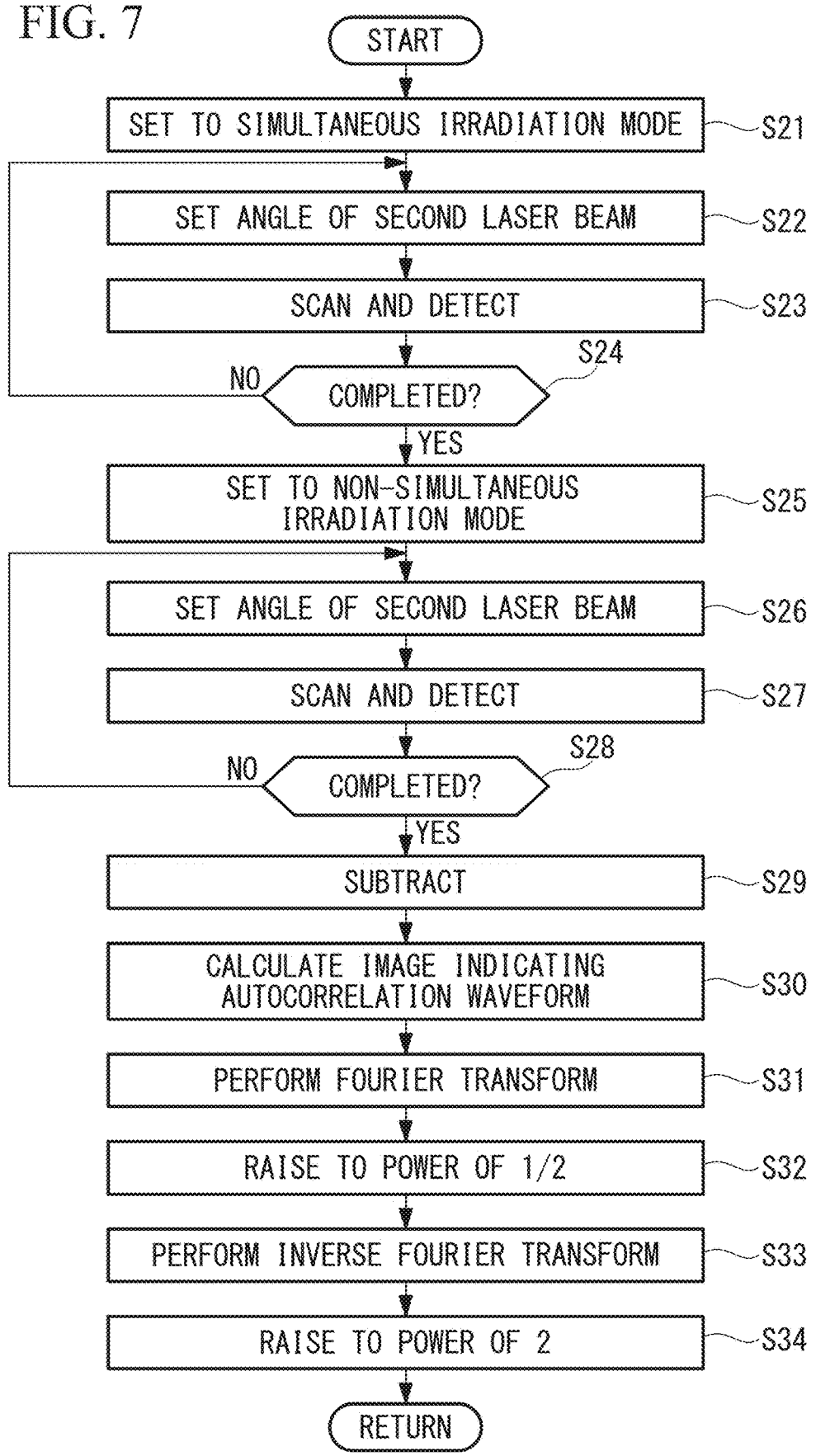
FIG. 7 is a flowchart illustrating a PSF measurement method according to an embodiment of the present invention.

Referring to FIG. 7, a PSF measurement method according to an embodiment of the present invention includes actuating the optical-path-length adjustment optical system 10 such that two illumination light beams are simultaneously radiated onto the sample X (step S21), setting the polarization angle of the second laser beam L2 by using the motorized holder 19 (step S22), actuating the scanning unit 4 to scan the two laser beams L1 and L2 over the sample X and detecting the intensity of fluorescence generated at each scan position (step S23, scanning step, detecting step), and determining whether or not acquisition of a first fluorescence intensity distribution is completed (step S24). If the acquisition is not completed, the process returns to step S22 where the polarization angle of the second laser beam L2 is slightly changed by using the motorized holder 19, and the process thereafter is repeated. Consequently, the first fluorescence intensity distribution with respect to a relative irradiation position can be acquired.

Subsequently, when the acquisition of the first fluorescence intensity distribution is completed, the optical-path-length adjustment optical system 10 is actuated such that two illumination light beams are non-simultaneously radiated onto the sample X (step S25), the polarization angle of the second laser beam is set by the motorized holder 19 (step S26), and the two laser beams are scanned over the sample X by actuating the scanning unit 4, and the intensity of fluorescence generated at each scan position is detected (step S27, scanning step, detecting step). Then, it is determined whether or not acquisition of a second fluorescence intensity distribution is completed (step S28). If the acquisition is not completed, the process returns to step S26 where the polarization angle of the second laser beam L2 is slightly changed by using the motorized holder 19, and the process thereafter is repeated. Consequently, the second fluorescence intensity distribution with respect to a relative irradiation position can be acquired.

By subtracting the acquired second fluorescence intensity distribution from the acquired first fluorescence intensity distribution, a third fluorescence intensity distribution from which an offset component is removed is obtained (step S29). The obtained third fluorescence intensity distribution is rotated around the axis extending through the peak so that an image indicating an autocorrelation waveform is acquired (calculating step S30). The acquired image undergoes Fourier transformation (step S31), is raised to the power of ½ (step S32), undergoes inverse Fourier transformation (step S33), and is further raised to the power of 2 (step S34). Consequently, the two-photon-excitation PSF shape of the laser beams at the focal points within the sample X can be determined.

Furthermore, if a signal value when the focal points P1 and P2 have a relative distance therebetween and thus do not overlap in FIG. 3 is to be set as an offset value, as described above, or if half of the signal peak value is to be set as an offset value, step S25 to step S28 can be omitted. After calculating an offset value in such a process, the offset value may be subtracted in step S29.

Although it is desirable that the position on the sample X where the PSF shape is to be measured and the position where an image of the sample X is to be acquired be the same, the positions may be different from each other if the PSF shape does not change. For example, the PSF-shape measurement and the image acquisition may be performed at different positions but at the same depth of the sample X.

In a case where an image of the sample X is to be three-dimensionally acquired while continuously changing the depth, for example, the PSF-shape measurement may be performed at several intermittent depth positions, and the PSF shape for regions between the positions may be calculated by interpolating the acquired PSF shape. Accordingly, an image with high spatial resolution can be effectively acquired in accordance with deconvolution while reducing the number of times the PSF shape is measured.

Figure 8:
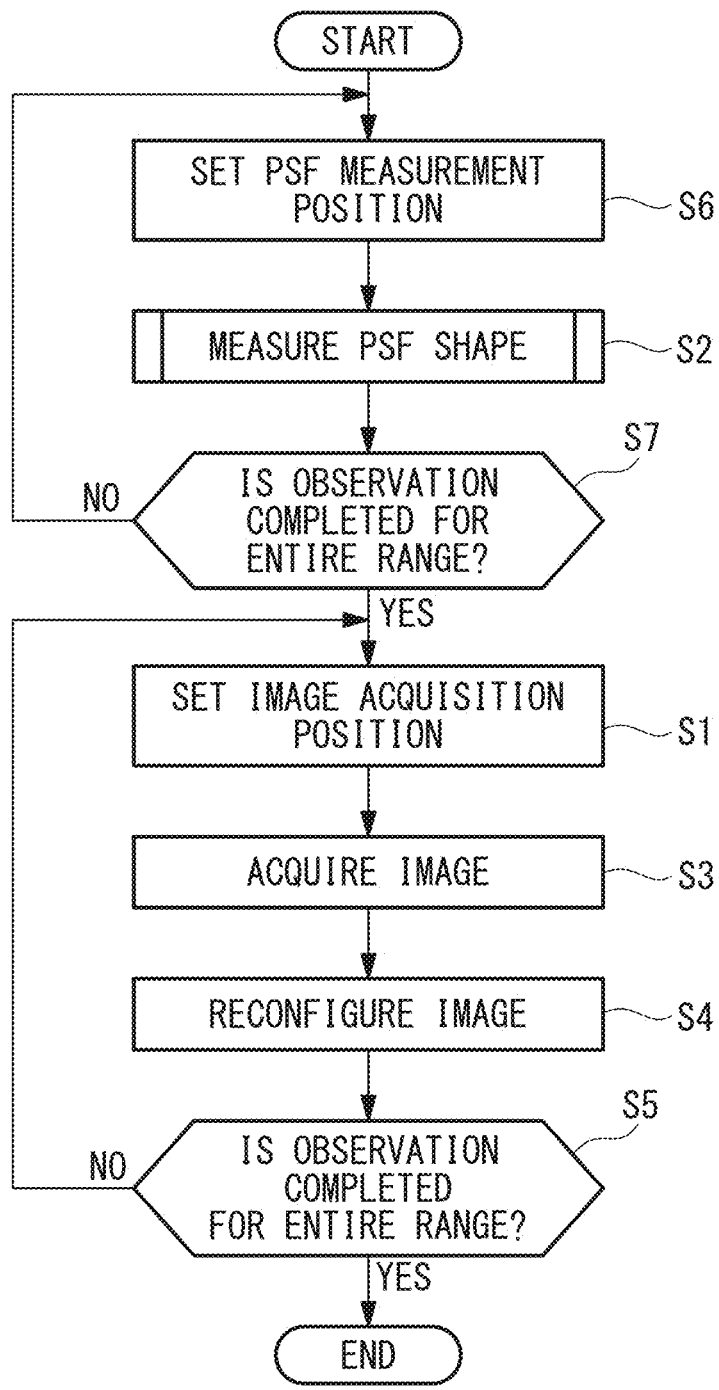
FIG. 8 is a flowchart illustrating an image acquisition method in a case where the PSF-shape measurement position and the image acquisition position are different from each other.

FIG. 8 illustrates the flow in a case where the PSF measurement position and the image acquisition position of the sample X are different from each other. In FIG. 8, a PSF-shape measurement position is set (step S6), and the PSF shape is measured at that position (step S2). It is determined whether or not there is another PSF-shape measurement position (step S7). If there is another measurement position, the process returns to step S6 to set the PSF measurement position again (step S6), and the PSF shape is measured (step S2). When the PSF measurement is completed, an image acquisition position is set (step S1), image acquisition is performed (step S3), and image reconfiguration is performed (step s4). The image acquisition is repeated until images are acquired for the entire field of view (step S5).

The flow of the process is not limited to the flow in FIG. 8. A process for calculating the PSF at positions other than the measurement positions by interpolating the PSF may be added, or the image reconfiguration may be performed collectively at the end.

Furthermore, a high-frequency component of the spatial frequency of the PSF may be optically accentuated by, for example, spatially modulating a laser beam to be input to the objective lens 17. If a mask that blocks off the center of a beam is to be used as the beam shaping element 14 in FIG. 1, the laser beam to be output from the objective lens 17 becomes annular and has a shape in which the high-frequency component is accentuated. Normally, when performing deep observation, the high-frequency components decrease due to scattering and aberration, causing the resolution to decrease. By optically accentuating the high-frequency components, a decrease in resolution can be suppressed.

When the high-frequency components are accentuated as in annular illumination, the PSF has an unnatural shape having side lobes. However, by measuring the PSF shape and performing deconvolution using the obtained PSF, the effect of the side lobes can be removed, and a fluorescence image having high resolution can be acquired. Specifically, the high-frequency component is optically accentuated by the beam shaping element 14, and the component is further accentuated by image processing in accordance with deconvolution and the effect of the side lobes is removed, so that a high-resolution image of the sample X can be obtained. In combination with the beam shaping element 14 that accentuates the high-frequency components of the PSF, the resolution of the fluorescence image can be further improved. As an alternative to a mask, the beam shaping element 14 may be a polarizing element that converts a polarized laser beam into a radially polarized beam; it is not limited so long as the beam shaping element 14 can optically accentuate the high-frequency components.

In order to acquire an autocorrelation waveform in this embodiment, a two-dimensional image is acquired by using the two-axis galvanometer mirror 21 while relatively changing the irradiation position of the first laser beam L1 and the irradiation position of the second laser beam L2. Alternatively, since this image is intended for acquisition of an autocorrelation waveform, the image may be one-dimensional, that is, linear, instead of two-dimensional.

Although the irradiation positions of the first laser beam L1 and the second laser beam L2 are relatively moved one-dimensionally, as shown in FIG. 2, this is intended to create a two-dimensional, rotationally symmetric autocorrelation waveform by rotating a one-dimensional autocorrelation waveform and is based on the assumption that the PSF shape to be measured is rotationally symmetric. Therefore, this cannot be applied in a case where the PSF shape is rotationally asymmetric.

Figure 9:
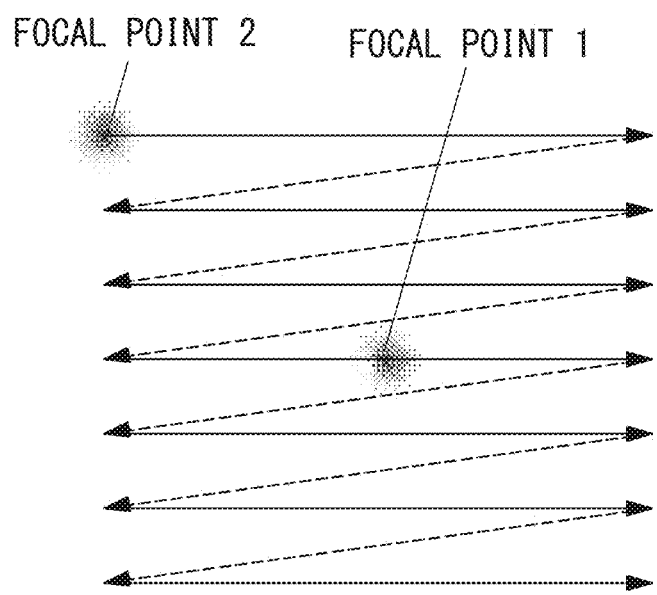
FIG. 9 illustrates an example of a PSF-shape measurement method of a laser beam in a case where the PSF in a sample is asymmetric.

As shown in FIG. 9, if the PSF shape is rotationally asymmetric, it is preferable that the irradiation position of the first laser beam L1 and the irradiation position of the second laser beam L2 be relatively scanned two-dimensionally. By performing a process similar to that in the above description by using an image of a two-dimensional autocorrelation waveform acquired in this manner, an autocorrelation waveform image of two-photon-excitation fluorescence can be acquired even when the PSF shape is rotationally asymmetric.

When the PSF shape is measured in this manner, deconvolution is performed based on the measured PSF shape, so that the resolution of the fluorescence image can be improved. In particular, in deep observation using a two-photon-excitation microscope, the PSF distribution changes in accordance with scattering occurring within the sample X or aberrations caused by the refractive index of the sample X. The image acquisition apparatus 1 according to this embodiment is advantageous in that the distribution of the PSF shape within the sample X is measured even in a deep section of the sample X, and in that a fluorescence image with high resolution can be acquired by means of deconvolution.

By using an image acquired when the PSF shape is measured as a sample image for performing deconvolution, the PSF-shape measurement and the sample-image acquisition do not have to be performed separately. This is advantageous in that the overall image acquisition time can be shortened.

Furthermore, as an alternative to this embodiment in which the half-wave plate 8 is disposed in front of the first polarization beam splitter 9, for example, a quarter-wave plate may be used so long as the first polarization beam splitter 9 is capable of splitting a laser beam into a first laser beam L1 and a second laser beam L2. Moreover, although the quarter-wave plate 12 is disposed behind the second polarization beam splitter 11, the quarter-wave plate 12 may be omitted so long as the polarization directions of the first laser beam L1 and the second laser beam L2 are orthogonal to each other when the laser beams are radiated onto the sample X.

However, because an autocorrelation waveform is acquired in a state where the polarization directions of the first laser beam L1 and the second laser beam L2 are orthogonal to each other, the cross-sectional shape of the PSF obtained with expression (7) is the same as that of circularly-polarized light, which has an intermediate shape between the shape of vertically-polarized light and the shape of horizontally-polarized light. Therefore, it is desirable that circularly-polarized light be acquired when an image of the sample X is to be acquired. Thus, it is desirable that the PSF-shape measurement be performed in a state where there is no quarter-wave plate 12 behind the second polarization beam splitter 11 and that the quarter-wave plate 12 be inserted in the optical path to obtain circularly-polarized light when an image of the sample X is to be acquired.

In this embodiment, the second polarization beam splitter 11, the beam shaping element 14, and the scanning unit 4 are disposed to have an optically conjugate positional relationship with the pupil position of the objective lens 17 by means of the two sets of relay lenses 13a and 13b, the pupil projection lens 15, and the imaging lens 16. Alternatively, as shown in FIG. 10, one of the sets of relay lenses 13a and 13b may be omitted, and the beam shaping element 14 may be disposed immediately behind the second polarization beam splitter 11.

Although it is preferable that the beam shaping element 14 be accurately disposed at an optically conjugate position with respect to the second polarization beam splitter 11 and the pupil position of the objective lens 17, the beam shaping element 14 can be disposed at a substantially conjugate position by being disposed immediately behind the second polarization beam splitter 11. Furthermore, since an angular difference between the first laser beam L1 and the second laser beam L2 output at different angles from the second polarization beam splitter 11 is extremely small, a variation in the positions where the first laser beam L1 and the second laser beam L2 pass through the beam shaping element 14 can be made small enough to be negligible even by disposing the beam shaping element 14 in this manner.

Figure 10:
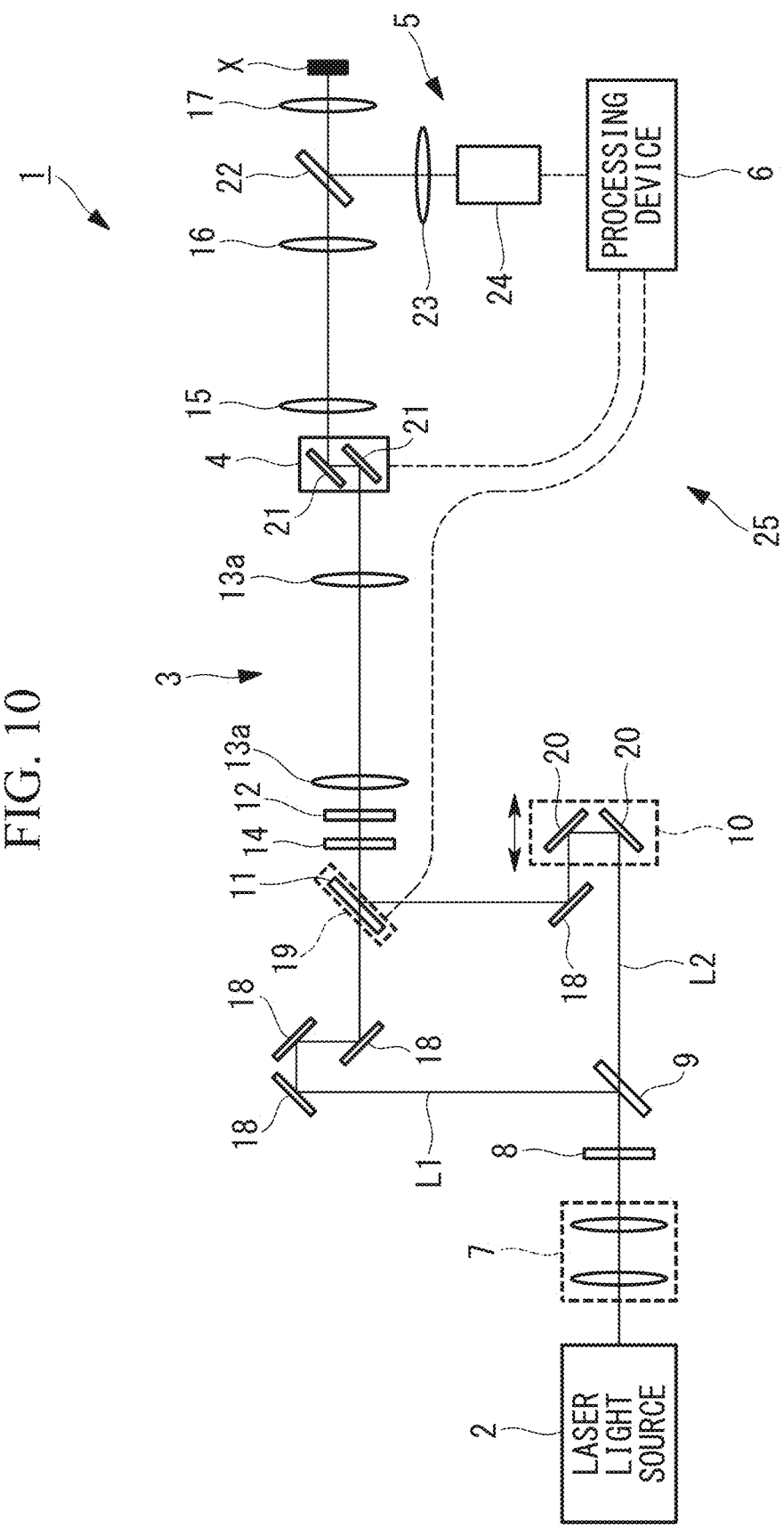
FIG. 10 schematically illustrates a first modification of the image acquisition apparatus in FIG. 1.

The configuration in FIG. 10 is advantageous in that the configuration of the image acquisition apparatus 1 exhibiting advantages similar to those in FIG. 1 can be simplified.

Figure 11:
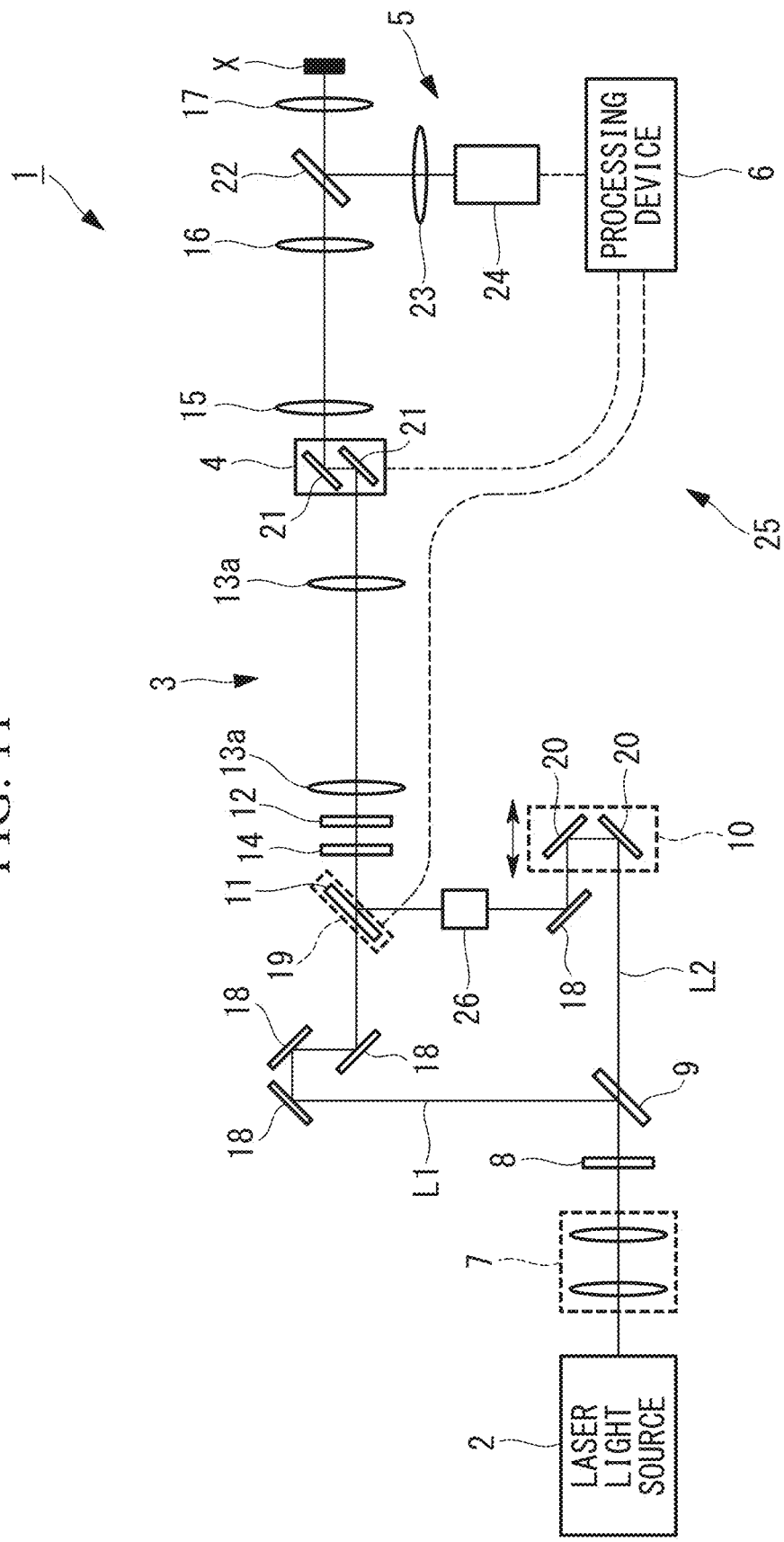
FIG. 11 schematically illustrates a second modification of the image acquisition apparatus in FIG. 1.

Furthermore, in this embodiment, a defocusing element 26 may be disposed in the optical path of the second laser beam L2 between the first polarization beam splitter 9 and the second polarization beam splitter 11, as shown in FIG. 11. The defocusing element 26 causes the second laser beam L2 to slightly scatter or converge so as to move (defocus), in the optical-axis direction, the focal point of the second laser beam L2 to be focused by the objective lens 17. The defocusing element 26 used may be an active device, such as a pair of lenses or a liquid lens.

In the image acquisition apparatus 1 in FIG. 1, the PSF shape is measured by relatively scanning the two focal points in the direction orthogonal to the optical axis, making it possible to measure only the PSF shape extending in the direction orthogonal to the optical axis. However, since a PSF extends three-dimensionally in actuality, an autocorrelation waveform is acquired and calculated by relatively scanning the two focal points also in the direction parallel to the optical axis, as in an image acquisition apparatus 27 shown in FIG. 11, so that a three-dimensionally-extending PSF shape can also be measured.

Accordingly, deconvolution can be performed three-dimensionally, so that when a three-dimensional fluorescence image is acquired, the spatial resolution can be improved three-dimensionally. In this case, similar to the image acquisition apparatus 1 in FIG. 1, the effect can be further enhanced by using the beam shaping element 14 to accentuate the high-frequency components of the spatial frequency of the PSF. In order to create a three-dimensional image of the PSF, the three-dimensional image may be acquired in accordance with a rotating process and an interpolation process from a PSF cross-sectional profile acquired within a plane orthogonal to the optical axis and a PSF cross-sectional profile acquired in the direction parallel to the optical axis.

Figure 12:
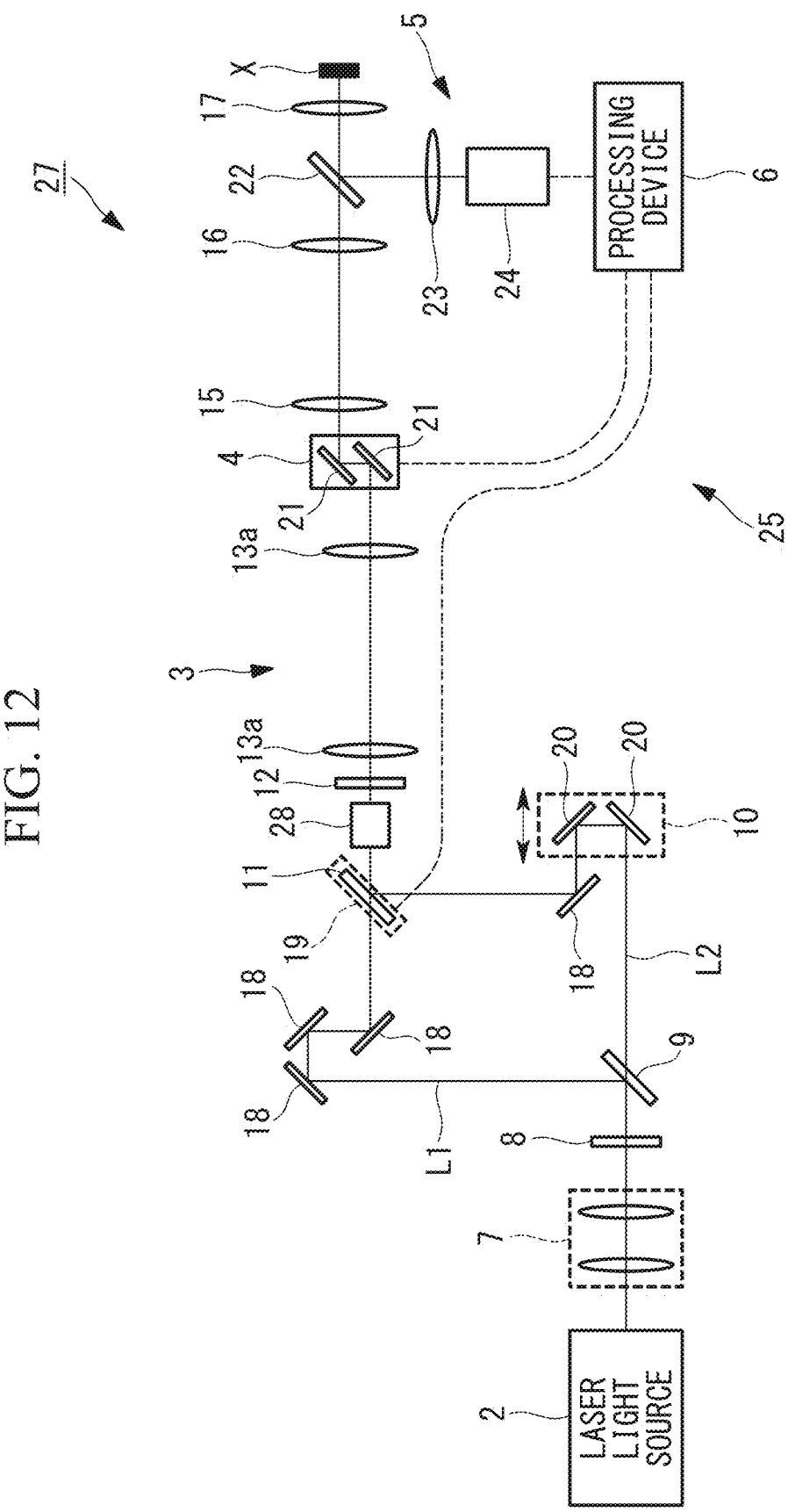
FIG. 12 schematically illustrates a third modification of the image acquisition apparatus in FIG. 1.

Furthermore, in this embodiment, as shown in FIG. 12, a spatial light modulator (light modulating unit) 28 may be disposed in place of the beam shaping element 14. The spatial light modulator 28 is used for correcting aberration of the focal point of a laser beam focused by the objective lens 17. First, the PSF shape is measured in a state where a laser beam is not modulated by the spatial light modulator 28. Thus, the state of the aberration can be ascertained from the acquired PSF shape. The aberration includes aberrations caused by both the optical system and the sample X. In the state where the aberration is ascertained and a single laser beam is used, the wave front of the laser beam may be modulated such that the aberration is corrected by the spatial light modulator 28, and a fluorescence image of the sample X may be acquired.

Accordingly, the PSF is corrected to have a shape with no aberration based on the measured PSF shape, whereby the resolution can be enhanced. Thus, image processing becomes unnecessary, and a fluorescence image with high spatial resolution can be acquired.

When ascertaining the state of aberration, simulation may be used together with the obtained PSF shape, or a PSF shape at a different depth may be compared therewith. For example, with regard to aberration occurring within the sample X, PSF shapes are measured in a shallow region and a deep region of the sample X. By comparing the shapes, aberration occurring as a result of propagation to the deep region of the sample X can be ascertained, and the laser beam is modulated by the spatial light modulator 28 such that the aberration is corrected, whereby the resolution in the deep region can be improved.

Furthermore, there is an advantage in that the spatial resolution can be further enhanced by measuring the PSF shape and acquiring an image of the sample X in a state where aberration is corrected by the spatial light modulator 28 and performing deconvolution by using the acquired image of the sample X and the measured PSF shape. Moreover, by optically accentuating a high-frequency component by using the beam shaping element 14, the resolution can be further improved.

Furthermore, as shown in FIG. 11, in a state where aberration is corrected by the spatial light modulator 28, the PSF shape may be three-dimensionally measured by using the defocusing element 26, thereby improving the spatial resolution three-dimensionally.

Figure 13:
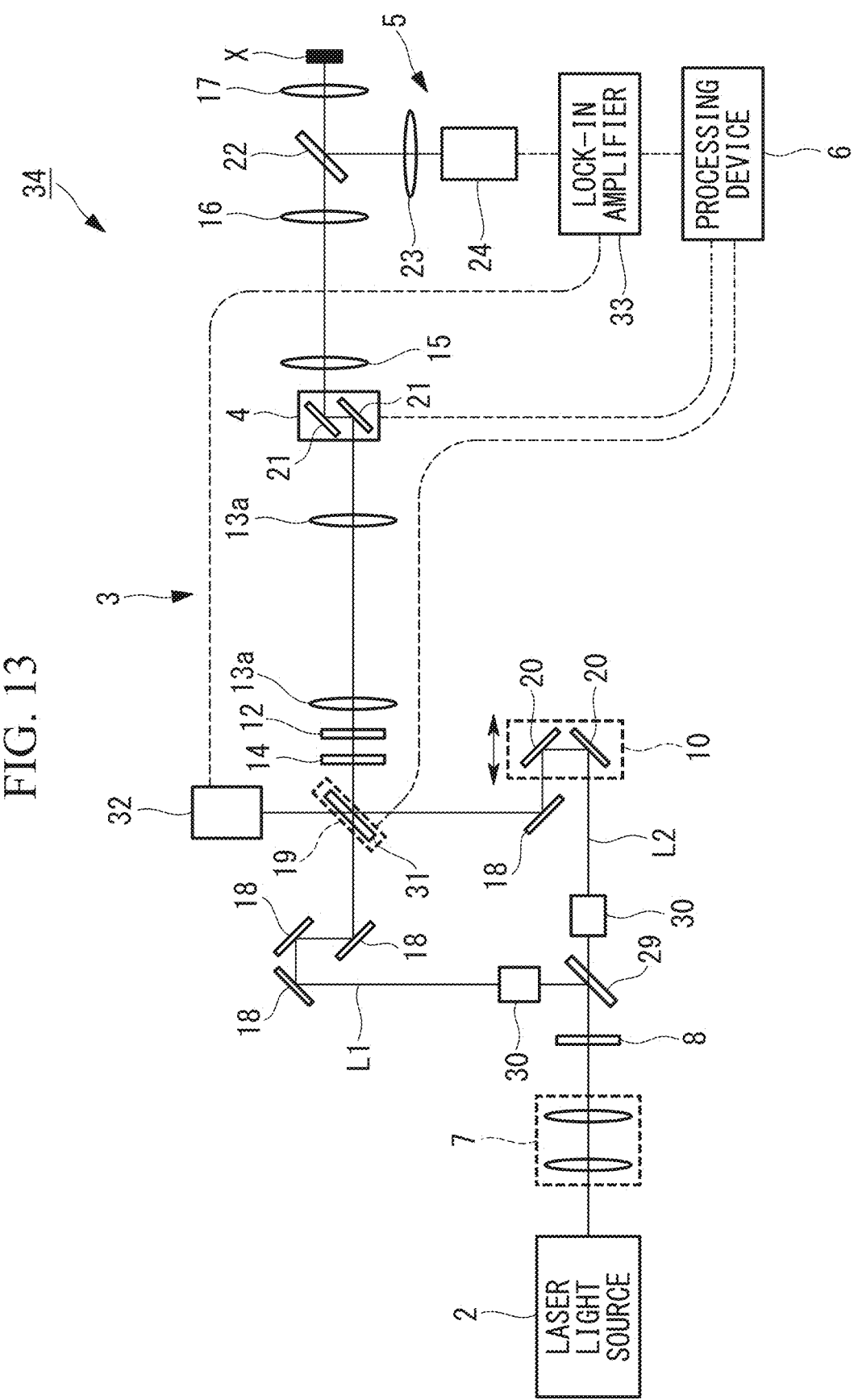
FIG. 13 schematically illustrates a fourth modification of the image acquisition apparatus in FIG. 1.

Furthermore, an image acquisition apparatus 34 having the structure shown in FIG. 13 may be employed.

The image acquisition apparatus 34 includes a first non-polarization beam splitter 29 in place of the first polarization beam splitter 9, acousto-optic elements 30 respectively disposed in two optical paths split by the beam splitter 29, and a second non-polarization beam splitter 31 in place of the second polarization beam splitter 11.

The image acquisition apparatus 34 also includes a detector 32 that detects a laser beam passing through the second polarization beam splitter 31, and a lock-in amplifier 33 that demodulates a signal having a predetermined frequency from a fluorescence signal detected by the photodetector 24 based on a detection signal obtained by the detector 32.

The two acousto-optic elements 30 slightly change the time frequencies of laser beams L1 and L2 traveling along the respective optical paths to different frequencies.

Normally, when laser beams having different frequencies overlap, a beat having a frequency corresponding to the difference between the frequencies occurs.

When scanning is to be performed while changing the relative position between the first laser beam L1 and the second laser beam L2 having different frequencies at the position of the sample X, a frequency component corresponding to the difference in frequency between the first laser beam L1 and the second laser beam L2 occurs at the overlapping position. Thus, by using the lock-in amplifier 33 to demodulate a signal having the frequency difference, the signal alone can be extracted from the overlapping position.

Specifically, a waveform from which an offset component is removed from the fluorescence intensity distribution shown in FIG. 3 can be acquired at one time. Therefore, by performing a process similar to that described above, a fluorescence image having high spatial resolution can be acquired by measuring the PSF shape in the image acquisition apparatus 34 in FIG. 13.

Accordingly, the image acquisition apparatus 34 shown in FIG. 13 can directly extract a fluorescence signal from the overlapping section between the first laser beam L1 and the second laser beam L2 without performing an offset subtracting process, and can also be applied to a one-photon-excitation microscope not involving a nonlinear optical process. Moreover, because this embodiment is characterized in that a signal is acquired from the overlapping position between the first laser beam L1 and the second laser beam L2, the spatial light modulator 28 or the defocusing element 26 described above can also be used. In a case where the embodiment is to be applied to one-photon excitation, the process for raising the acquired image to the power of 2, which corresponds to step S34 in FIG. 7, is not necessary.

In order to cause beating of the laser beams to occur, the two polarized light beams to be multiplexed need to overlap each other. Therefore, unlike other embodiments, non-polarization beam splitters 29 and 31 are used. Although this implies that the multiplexed laser beam is output in a direction other than the direction toward the beam shaping element 14, since this laser beam also has a beat component, this signal is detected by the detector 32 and is set as a reference signal of the lock-in amplifier 33 so as to be used without waste.

Although several embodiments of the present invention have been described above, the present invention is not limited to these embodiments.

For example, although the first laser beam L1 and the second laser beam L2 are generated by using a laser beam from the same light source 2, laser beams emitted from different light sources may alternatively be used. In that case, the two laser beams L1 and L2 may have different wavelengths, and the PSF shape to be acquired is an average shape of the PSF shapes of the two laser beams L1 and L2. Moreover, as an alternative to the use of the two-axis galvanometer mirror 21 as the scanning unit 4, a method of acquiring an image by stage scanning may be employed.

Although a two-photon-excitation microscope is described in the above embodiments, the present invention may be applied to a microscope of another type, such as an SHG microscope, so long as the microscope is of a scanning type that utilizes a nonlinear optical process.

From the above-described embodiments, the following aspects of the present disclosure are derived.

An aspect of the present disclosure provides a point-spread-function measurement device comprising: a scanning unit that scans two illumination light beams emitted from a light source; an illumination optical system that radiates the two illumination light beams scanned by the scanning unit onto a sample; a relative-position adjustment unit that changes a relative irradiation position, in the sample, between the two illumination light beams radiated by the illumination optical system; a detection optical system that detects signal light generated at an overlapping position, in the sample, of the illumination light beams radiated by the illumination optical system; and a calculating unit that calculates a point spread function based on the signal light detected by the detection optical system and the relative irradiation position between the two illumination light beams when the signal light is detected.

According to this aspect, when the two illumination light beams emitted from the light source are scanned by the scanning unit and are radiated onto the sample by the illumination optical system, signal light is generated at the irradiation position of each illumination light beam and is detected by the detection optical system. By repeatedly scanning and detecting the two illumination light beams while actuating the relative-position adjustment unit to vary the relative irradiation position between the two illumination light beams, the point spread function is calculated by the calculating unit from the relationship between the relative irradiation position and the intensity of the detected signal light.

In this case, the point spread function of the illumination light beams at a freely-chosen position of the sample can be determined without applying an additional process to the sample, such as disposing a fluorescence bead in the sample as in the related art.

In the above aspect, the calculating unit may calculate the point spread function by determining an autocorrelation waveform.

Accordingly, the point spread function can be accurately calculated from the autocorrelation waveform.

Specifically, by varying the relative irradiation position between the two illumination light beams, the overlapping of the two illumination light beams in the sample changes. When the two illumination light beams are in a completely non-overlapped state, signal light equivalent to the sum of signal light beams generated by the two independent illumination light beams is generated. When the two illumination light beams are in a completely overlapped state, signal light with the maximum intensity is generated. By using an intensity profile of the signal light according to the relative irradiation position, the point spread function can be accurately determined.

Furthermore, in the above aspect, the illumination optical system may set polarization states of the two illumination light beams such that the polarization states are orthogonal to each other.

Accordingly, the occurrence of an excessive signal light component caused by electric-field interference between the illumination light beams when the two illumination light beams overlap can be suppressed, so that the point spread function can be accurately determined.

Furthermore, in the above aspect, the signal light may be generated in a nonlinear optical process in accordance with irradiation of the illumination light beams.

Accordingly, even when the sample is to be observed by utilizing a linear optical process, the spatial resolution can be improved in accordance with the point spread function.

Furthermore, in the above aspect, the illumination light beams may be ultra-short pulsed laser beams, and the signal light may be fluorescence generated in accordance with a multiphoton absorption effect.

Accordingly, by utilizing the multiphoton absorption effect occurring as a result of radiating an ultra-short pulsed layer beam onto the sample, the spatial resolution can be improved in accordance with the point spread function when fluorescence observation is performed.

Furthermore, in the above aspect, at least one signal light image having at least a one-dimensional size may be acquired by using the signal light detected by the detection optical system, and the calculating unit may calculate the autocorrelation waveform by using the signal light image.

Accordingly, the point spread function can be determined at any position of any kind of sample so long as signal light can be detected.

Furthermore, in the above aspect, the calculating unit may calculate the point spread function by performing Fourier transformation of the autocorrelation waveform.

Accordingly, the point spread function can be accurately determined from the autocorrelation waveform.

Furthermore, in the above aspect, the illumination light beams may be pulsed light beams, the illumination optical system may include a timing adjustment unit that switches the timing for radiating the two illumination light beams onto the sample between a simultaneous mode and a non-simultaneous mode, and the calculating unit may calculate the point spread function by using a difference between signal light detected in the simultaneous mode switched by the timing adjustment unit and signal light detected in the non-simultaneous mode switched by the timing adjustment unit.

Accordingly, when the timing adjustment unit switches the timing for radiating the two illumination light beams onto the sample to the simultaneous mode, overlapping of the two illumination light beams occurs within the sample in accordance with the relative irradiation position, and signal light that changes in intensity in accordance with the degree of overlapping can be detected. When the irradiation timing is switched to the non-simultaneous mode, overlapping of the two illumination light beams does not occur, and an offset component of signal light that does not change in response to a change in the relative irradiation position can be detected. Therefore, by calculating the difference, signal-light intensity distribution from which the offset component is removed can be calculated, and the point spread function can be accurately calculated by using this signal-light intensity distribution.

Furthermore, in the above aspect, the illumination optical system may include a light modulating unit that modulates a spatial distribution or polarization states of the illumination light beams so that a high-frequency component is accentuated in a spatial frequency distribution of the point spread function.

Accordingly, the high-frequency component can be optically accentuated when signal light is generated in the sample, and the spatial resolution can be enhanced.

Another aspect of the present disclosure provides a point-spread-function measurement method comprising: a scanning step for scanning two illumination light beams emitted from a light source over a sample while changing a relative irradiation position in the sample; a detecting step for detecting signal light generated at an overlapping position, in the sample, of the illumination light beams radiated in the scanning step; and a calculating step for calculating a point spread function based on the signal light detected in the detecting step and the relative irradiation position between the two illumination light beams when the signal light is detected.

In the above aspect, the calculating step may include calculating the point spread function by determining an autocorrelation waveform.

Furthermore, in the above aspect, the scanning step may include setting polarization states of the two illumination light beams such that the polarization states are orthogonal to each other and performing the scanning.

Furthermore, in the above aspect, the signal light may be generated in a nonlinear optical process in accordance with irradiation of the illumination light beams.

Furthermore, in the above aspect, the illumination light beams are ultra-short pulsed laser beams, and the signal light is fluorescence generated in accordance with a multiphoton absorption effect.

Furthermore, in the above aspect, the detecting step may include acquiring at least one signal light image having at least a one-dimensional size by using the detected signal light, and the calculating step may include calculating the autocorrelation waveform by using the signal light image.

Furthermore, in the above aspect, the calculating step may include calculating the point spread function by performing Fourier transformation of the autocorrelation waveform.

Furthermore, in the above aspect, the illumination light beams may be pulsed light beams, the scanning step may include performing the scanning by switching the timing for radiating the two illumination light beams onto the sample between a simultaneous mode and a non-simultaneous mode, and the calculating step may include calculating the point spread function by using a difference between signal light detected in the simultaneous mode switched in the scanning step and signal light detected in the non-simultaneous mode switched in the scanning step.

Furthermore, in the above aspect, the scanning step may include modulating a spatial distribution or polarization states of the illumination light beams so that a high-frequency component is accentuated in a spatial frequency distribution of the point spread function.

Another aspect of the present disclosure provides an image acquisition apparatus comprising: any one of the above-described point-spread-function measurement devices; and an image processor that generates an image of the sample by using the point spread function measured by the measurement device.

According to this aspect, the image processor generates an image of the sample by using the point spread function measured by the measurement device, so that blurriness in the sample image can be reduced.

In the above aspect, the image processor may generate a sample image acquired as a result of the illumination optical system radiating the illumination light beams emitted from the light source and scanned by the scanning unit onto the sample and the detection optical system detecting the signal light generated at the irradiation positions in the sample, and may reconfigure the generated sample image by using the point spread function measured by the measurement device.

Accordingly, by reconfiguring the sample image by using the point spread function, blurriness can be effectively reduced.

Furthermore, in the above aspect, the image processor may reconfigure the sample image by performing deconvolution on the sample image by using the point spread function.

Accordingly, by performing deconvolution, blurriness in the sample image can be effectively reduced.

Another aspect of the present disclosure provides image acquisition method comprising: any one of the above-described measurement methods; and an image processing step for generating a sample image by using a point spread function measured in accordance with the measurement method.

In the above aspect, the image processing step may include an image generating step for generating the sample image acquired as a result of scanning the illumination light beams from the light source onto the sample and detecting the signal light generated at the irradiation positions in the sample, and a reconfiguring step for reconfiguring the sample image generated in the image generating step by using the point spread function measured in accordance with the measurement method.

Furthermore, in the above aspect, the image processing step may include reconfiguring the sample image by performing deconvolution on the sample image by using the point spread function.

According to the aforementioned aspects, an advantageous effect is afforded in that a point spread function can be acquired without applying an additional process to a sample.

REFERENCE SIGNS LIST 1, 27, 34 image acquisition apparatus
2 light source
3 illumination optical system
4 scanning unit
5 detection optical system
10 optical-path-length adjustment optical system (timing adjustment unit)
14 beam shaping element (light modulating unit)
19 motorized holder (relative-position adjustment unit)
25 measurement device
28 spatial light modulator (light modulating unit)
S3 image generating step, image processing step
S4 reconfiguring step, image processing step
S23, S27 scanning step, detecting step
S30 calculating step
L1, L2 laser beam (illumination light beam)
X sample

The invention claimed is:

1. A point-spread-function measurement device comprising:
a scanner configured to scan two illumination light beams emitted from a light source;
an illumination optical system configured to radiate the two illumination light beams scanned by the scanner onto a sample;
a relative-position adjustor configured to repeatedly change a relative irradiation position, in the sample, between the two illumination light beams radiated by the illumination optical system if an acquisition of a light intensity distribution is not completed;
a detection optical system configured to detect signal light generated at an overlapping position, in the sample, of the illumination light beams radiated by the illumination optical system in each time the relative illumination position radiated by the two illumination lights, in the sample, is repeatedly changed by the relative-position adjustor; and
a calculator configured to calculate a point spread function based on the light intensity distribution, the light intensity distribution being a distribution indicating an intensity of the signal light at each distance between the relative irradiation positions radiated by the two illumination lights in the sample.

2. The point-spread-function measurement device according to claim 1,
wherein the calculator is configured to calculate the point spread function by determining an autocorrelation waveform of the illumination light in two-dimensional space based on the light intensity distribution.

3. The point-spread-function measurement device according to claim 2,
wherein at least one signal light image having at least a one-dimensional size is acquired by using the signal light detected by the detection optical system, and
wherein the calculator is configured to calculate the autocorrelation waveform by using the signal light image.

4. The point-spread-function measurement device according to claim 2,
wherein the calculator is configured to calculate the point spread function by performing Fourier transformation of the autocorrelation waveform.

5. The point-spread-function measurement device according to claim 2,
wherein the calculator calculates the autocorrelation waveform of the illumination light in two-dimensional space by creating a rotationally symmetric image in which the light intensity distribution is rotated.

6. The point-spread-function measurement device according to claim 2,
wherein the relative-position adjustor repeatedly changes a relative irradiation position, in the sample, between the two illumination light beams in a two-dimensional direction, and
wherein the calculator calculates the autocorrelation waveform of the illumination light in two-dimensional space based on a two-dimensional light intensity distribution acquired by changing a relative irradiation position in the sample in a two-dimensional direction.

7. The point-spread-function measurement device according to claim 6,
wherein the illumination optical system is configured to set polarization states of the two illumination light beams such that the polarization states are orthogonal to each other.

8. The point-spread-function measurement device according to claim 1,
wherein the illumination optical system is configured to set polarization states of the two illumination light beams such that the polarization states are orthogonal to each other.

9. The point-spread-function measurement device according to claim 1,
wherein the signal light is generated in a nonlinear optical process in accordance with irradiation of the illumination light beams.

10. The point-spread-function measurement device according to claim 9,
wherein the illumination light beams are ultra-short pulsed laser beams, and wherein the signal light is fluorescence generated in accordance with a multiphoton absorption effect.

11. The point-spread-function measurement device according to claim 1 or 2,
wherein the illumination light beams are pulsed light beams,
wherein the illumination optical system includes a timing adjustor configured to switch the timing for radiating the two illumination light beams onto the sample between a simultaneous mode and a non-simultaneous mode, and wherein the calculator is configured to calculate the point spread function by using a difference between signal light detected in the simultaneous mode switched by the timing adjustor and signal light detected in the non-simultaneous mode switched by the timing adjustor.

12. The point-spread-function measurement device according to claim 1, wherein the illumination optical system includes a light modulator configured to modulate a spatial distribution or polarization states of the illumination light beams so that a high-frequency component is accentuated in a spatial frequency distribution of the point spread function.

13. An image acquisition apparatus comprising:
the point-spread-function measurement device according to claim 1; and
an image processor that generates an image of the sample by using the point spread function measured by the measurement device.

14. The image acquisition apparatus according to claim 13, wherein the image processor generates a sample image acquired as a result of the illumination optical system radiating the illumination light beams emitted from the light source and scanned by the scanner onto the sample and the detection optical system detecting the signal light generated at the irradiation positions in the sample, and reconfigures the generated sample image by using the point spread function measured by the measurement device.

15. The image acquisition apparatus according to claim 14, wherein the image processor reconfigures the sample image by performing deconvolution on the sample image by using the point spread function.

16. The point-spread-function measurement device according to claim 1, wherein the calculator integrates the signal light detected by the detection optical system to obtain the light intensity distribution.

17. A point-spread-function measurement method comprising:
scanning two illumination light beams emitted from a light source over a sample while repeatedly changing a relative irradiation position in the sample if an acquisition of a light intensity distribution is not completed;
detecting signal light generated at an overlapping position, in the sample, of the illumination light beams radiated in each time the relative illumination position radiated by the two illumination lights, in the sample, is repeatedly changed; and
calculating a point spread function based on the light intensity distribution, the light intensity distribution being a distribution indicating an intensity of the signal light at each distance between the relative irradiation positions radiated by the two illumination lights in the sample.

18. The point-spread-function measurement method according to claim 17, wherein the calculating of the point spread function includes calculating the point spread function by determining an autocorrelation waveform of the illumination light in two-dimensional space based on the light intensity distribution.

19. The point-spread-function measurement method according to claim 18, wherein the detecting of the signal light generated at an overlapping position includes acquiring at least one signal light image having at least a one-dimensional size by using the detected signal light, and wherein the calculating of the point spread function includes calculating the autocorrelation waveform by using the signal light image.

20. The point-spread-function measurement method according to claim 18, wherein the calculating of the point spread function includes calculating the point spread function by performing Fourier transformation of the autocorrelation waveform.

21. The point-spread-function measurement method according to claim 18, wherein the calculating of the point spread function includes calculating the autocorrelation waveform of the illumination light in two-dimensional space by creating a rotationally symmetric image in which the light intensity distribution is rotated.

22. The point-spread-function measurement method according to claim 18, wherein the relative-position adjusting of the point spread function includes repeatedly changing a relative irradiation position, in the sample, between the two illumination light beams in a two-dimensional direction, and wherein the calculating of the point spread function includes calculating the autocorrelation waveform of the illumination light in two-dimensional space based on a two-dimensional light intensity distribution acquired by changing a relative irradiation position in the sample in a two-dimensional direction.

23. The point-spread-function measurement method according to claim 22, wherein the scanning of the two illumination light beams includes setting polarization states of the two illumination light beams such that the polarization states are orthogonal to each other and performing the scanning.

24. The point-spread-function measurement method according to claim 17, wherein the scanning of the two illumination light beams includes setting polarization states of the two illumination light beams such that the polarization states are orthogonal to each other and performing the scanning.

25. The point-spread-function measurement method according to claim 17, wherein the signal light is generated in a nonlinear optical process in accordance with irradiation of the illumination light beams.

26. The point-spread-function measurement method according to claim 25, wherein the illumination light beams are ultra-short pulsed laser beams, and wherein the signal light is fluorescence generated in accordance with a multiphoton absorption effect.

27. The point-spread-function measurement method according to claim 17, wherein the illumination light beams are pulsed light beams, wherein the scanning of the two illumination light beams includes performing the scanning by switching the timing for radiating the two illumination light beams onto the sample between a simultaneous mode and a non-simultaneous mode, and wherein the calculating of the point spread function includes calculating the point spread function by using a difference between signal light detected in the simultaneous mode switched and signal light detected in the non-simultaneous mode switched.

28. The point-spread-function measurement method according to claim 17, wherein the scanning of the two illumination light beams includes modulating a spatial distribution or polarization states of the illumination light beams so that a high-frequency component is accentuated in a spatial frequency distribution of the point spread function.

29. An image acquisition method comprising:

the measurement method according to claim 17; and generating a sample image by using a point spread function measured in accordance with the measurement method.

30. The image acquisition method according to claim 29, wherein the generating of the sample image includes generating the sample image acquired as a result of scanning the illumination light beams from the light source onto the sample and detecting the signal light generated at the irradiation positions in the sample, and reconfiguring the sample image generated by using the point spread function measured in accordance with the measurement method.

31. The image acquisition method according to claim 30, wherein the generating of the sample image includes reconfiguring the sample image by performing deconvolution on the sample image by using the point spread function.

32. The point-spread-function measurement method according to claim 17, wherein the calculating of the point spread function includes integrating the detected signal light to obtain the light intensity distribution.

* * * * *